United States Patent
Onoda et al.

(10) Patent No.: US 10,705,628 B2
(45) Date of Patent: Jul. 7, 2020

(54) ELECTRONIC PEN

(71) Applicant: Wacom Co., Ltd., Saitama (JP)

(72) Inventors: Naoto Onoda, Tokyo (JP); Shinya Aoki, Saitama (JP); Yasutatsu Nishihara, Chiba (JP)

(73) Assignee: Wacom Co., Ltd., Saitama (JP)

( * ) Notice: Subject to any disclaimer, the term of this patent is extended or adjusted under 35 U.S.C. 154(b) by 0 days.

(21) Appl. No.: 16/201,772

(22) Filed: Nov. 27, 2018

(65) Prior Publication Data
US 2019/0196608 A1  Jun. 27, 2019

(30) Foreign Application Priority Data
Dec. 26, 2017  (JP) .................... 2017-249612

(51) Int. Cl.
| | |
|---|---|
| *G06F 3/0354* | (2013.01) |
| *H01R 24/60* | (2011.01) |
| *H01R 13/6581* | (2011.01) |
| *H01R 13/6594* | (2011.01) |
| *G06F 3/038* | (2013.01) |
| *H05K 5/00* | (2006.01) |
| *H01R 107/00* | (2006.01) |
| *H01R 13/52* | (2006.01) |

(52) U.S. Cl.
CPC ........ *G06F 3/03545* (2013.01); *G06F 3/0383* (2013.01); *H05K 5/0039* (2013.01); *H01R 13/5213* (2013.01); *H01R 13/6581* (2013.01); *H01R 13/6594* (2013.01); *H01R 24/60* (2013.01); *H01R 2107/00* (2013.01)

(58) Field of Classification Search
CPC .............. G06F 3/03545; G06F 3/0383; H01R 13/5213; H01R 13/6581; H01R 13/6594; H01R 2107/00; H01R 24/60; H05K 5/0039
See application file for complete search history.

(56) References Cited

U.S. PATENT DOCUMENTS

| | | | |
|---|---|---|---|
| 2002/0063700 A1* | 5/2002 | Kobayashi .......... | B29C 45/0025 345/179 |
| 2004/0190092 A1* | 9/2004 | Silverbrook ........ | G06F 3/03545 358/539 |

(Continued)

FOREIGN PATENT DOCUMENTS

| | | |
|---|---|---|
| JP | 2011-186803 A | 9/2011 |
| JP | 2013-161307 A | 8/2013 |
| JP | 2017-208237 A | 11/2017 |

*Primary Examiner* — Afroza Chowdhury
(74) *Attorney, Agent, or Firm* — Seed IP Law Group LLP

(57) ABSTRACT

An electronic pen has a cylindrical chassis, a circuit board disposed within a pillar-shaped hollow portion of the chassis, and a connector exposable from an opening in the chassis to outside of the chassis. The connector includes a housing and a shell. The shell has a first size in a direction parallel to a planar surface of a contact portion of the connector and orthogonal to the axial direction of the chassis that is smaller than a diameter of the hollow portion of the chassis. The shell is coupled to the circuit board in a state in which the direction of the first size of the shell is parallel to a planar surface of the circuit board, and a width of the circuit board in a direction orthogonal to the axial direction of the circuit board is less than the first size of the shell.

10 Claims, 4 Drawing Sheets

(56) References Cited

U.S. PATENT DOCUMENTS

| | | | | |
|---|---|---|---|---|
| 2008/0128180 A1* | 6/2008 | Perski | ............... | G06F 3/03545 |
| | | | | 178/18.03 |
| 2013/0249870 A1* | 9/2013 | Slaby | ............... | G06F 3/044 |
| | | | | 345/179 |
| 2014/0192029 A1* | 7/2014 | Heo | ............... | G06F 3/03545 |
| | | | | 345/179 |
| 2015/0015547 A1* | 1/2015 | Lin | ............... | G06F 3/03545 |
| | | | | 345/179 |
| 2015/0317001 A1* | 11/2015 | Ben-Bassat | ............... | G06F 3/03545 |
| | | | | 345/179 |
| 2016/0109967 A1* | 4/2016 | Craig | ............... | G06F 3/03545 |
| | | | | 345/179 |
| 2018/0011550 A1* | 1/2018 | Mihal | ............... | G06F 3/03545 |

* cited by examiner

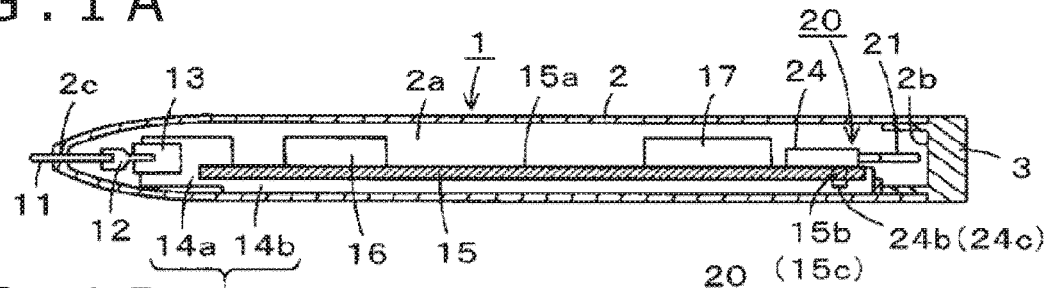
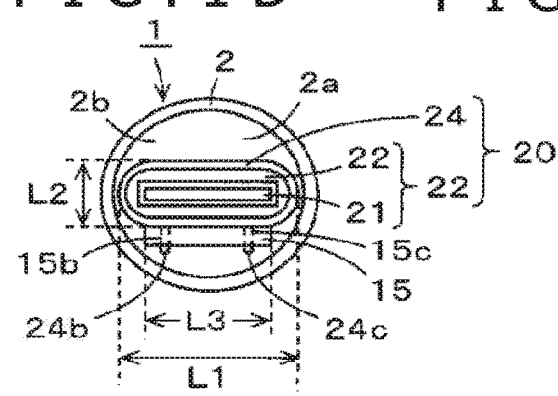
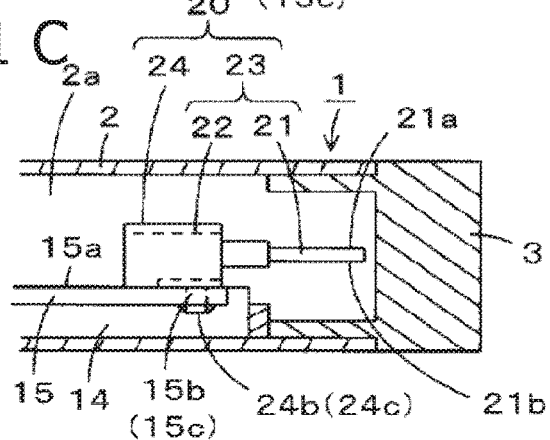
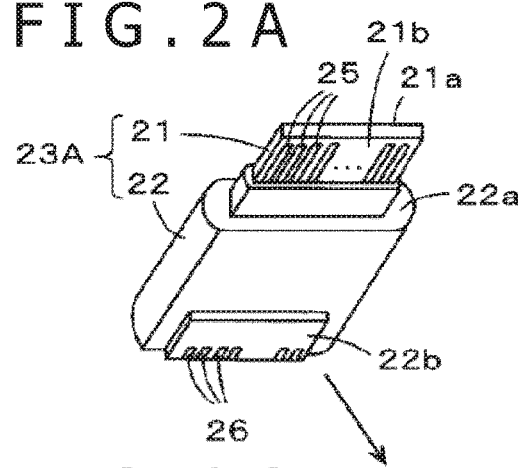
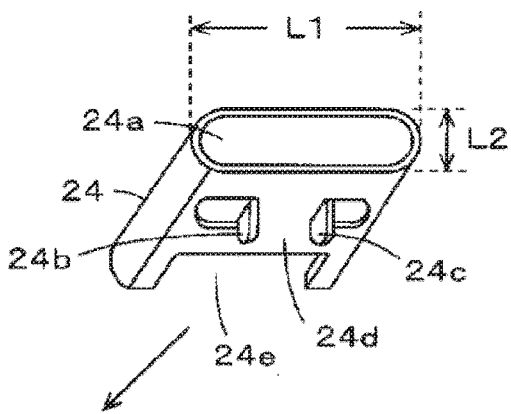
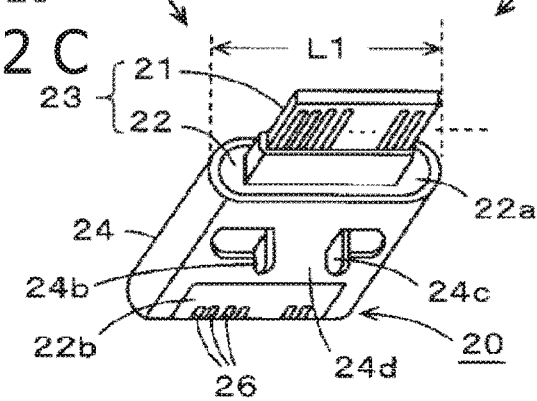

ELECTRONIC PEN

BACKGROUND

Technical Field

The present disclosure relates to an electronic pen which is used together with a position detecting device.

Background Art

In recent years, for the purpose of strongly transmitting a signal to a sensor portion of a position detecting device, a battery-powered electronic pen has been utilized. In the case where a rechargeable battery (secondary battery) is used as a battery in this case, a method of carrying out charging in a contact point contact manner or a contact point non-contact manner by using a dedicated charger has been generally used as a method of charging the secondary battery. However, the preparation of the dedicated charger is troublesome and costly.

On the other hand, in recent years, a method of carrying out the charging by using a universal serial bus (USB) connector has been widely utilized. The charging method using the USB connector is utilized in a wide variety of portable terminals because the charger only has to be general-purpose one. Then, if the charging method using the USB connector can also be applied to the electronic pen, then, this is very convenient.

Now, a shape and a size of the USB connector have been changed in terms of a communication speed, stability, strength, and convenience. At present, a type C of USB connector which is slightly larger than a small micro type B of USB connector is utilized. Japanese Patent Laid-Open No. 2017-208237 discloses the type C of USB connector.

FIG. 7 and FIG. 8 are views for explaining an example of an existing construction of the type C of USB connector. FIG. 7 is a perspective view of a USB connector 100 of this example. In addition, FIG. 8 is a view depicting a state in which the USB connector 100 of this example is mounted to a circuit board 110. As depicted in FIG. 7 and FIG. 8, the USB connector 100 of this example is constructed in such a way that a housing 103 including a base portion 101 and a contact portion 102 is covered by a shell 104.

The base portion 101 and the contact portion 102 of the housing 103, for example, are made of resins. Then, the contact portion 102 is constructed by a plate-shaped body of a flat plate. As depicted in FIG. 7, a plurality of line-shaped contact conductors 105 is arranged side by side in parallel to one another in a state in which they are aligned on a front surface (plane) and a back surface (plane) of the plate-shaped body.

The base portion 101 has a flat shape having a thickness which is slightly larger than the board thickness of the contact portion 102, and having a length which is slightly larger than a length in an alignment direction of a plurality of contact conductors 105 of the contact portion 102. The contact portion 102 is constructed so as to be set upright in a direction orthogonal to an end portion 101a from a central portion of the end surface 101a of the base portion 101.

The base portion 101 is provided with terminal portions (not depicted), which are electrically connected to a plurality of contact conductors 105 of the contact portion 102, individually, on a side opposite to a side of coupling to the contact portion 102.

The shell 104 has a cylindrical shape having a hollow portion 104a which is slightly larger than the base portion 101 of the housing 103. A length L (refer to FIG. 8) in the alignment direction of a plurality of contact conductors 105 of the contact portion 102 of the shell 104 is set by adding the thickness of the shell 104 to the length in the alignment direction of a plurality of contact conductors 105 of the contact portion 102 of the base portion 101. Then, a length in an axial direction of the hollow portion 104a of the shell 104, in this example, is selected so as to be approximately equal to a length from the end surface on a side opposite to the end surface 101a of the base portion 101 of the housing 103 to a head portion of the contact portion 102.

As depicted in FIG. 7, the shell 104 is constructed to surround the housing 103 in a state in which the end surface 101a side of the base portion 101 is exposed, thereby fixing the housing 103 to the inside of the shell 104. At this time, as depicted in FIG. 7 and FIG. 8, in the contact portion 102 of the housing 103, in a state in which a predetermined space is left without contacting the shell 104, a head surface side of the plate-shaped body in which the contact conductor 105 is formed is exposed from one opening side of the hollow portion 104a.

The shell 104 is made of a conductive metal, and is electrically connected to a ground conductor as a reference electric potential conductor provided in the housing 103. As depicted in FIG. 7 and FIG. 8, the shell 104 is provided with protrusion portions 104b, 104c, 104d, and 104e (a protrusion portion 104e is not depicted in FIG. 7) for connection to the circuit board 110. In this example, as depicted in FIG. 7 and FIG. 8, the protrusion portions 104b, 104c, 104d, and 104e are formed in both end portions in an alignment direction of a plurality of contact conductors 105 of the contact portion 102 of the shell 104.

Then, the protrusion portions 104b, 104c, 104d, and 104e of the shell 104 are, respectively, fitted to fitting holes 110b, 110c, 110d, and 110e, provided in a ground conductor (not depicted) of the circuit board 110 and are then soldered, thereby mounting to the connector 100 to the circuit board 110.

A mating connector to the USB connector 100 is inserted into the hollow portion 104a of the shell 104 along a formation direction of the line-shaped contact conductor 105 of the contact portion 102, thereby being coupled to the USB connector 100.

In the case where the USB connector 100 described above is mounted to the electronic pen, the mating connector is provided so as to be inserted from a direction along the axial direction of the cylindrical chassis of the electronic pen into an opening portion on a side opposite to the pen tip side of the cylindrical chassis of the electronic pen. For this reason, when viewed from the opening side opposite to the pen tip side of the cylindrical chassis of the electronic pen, the USB connector 100 is provided within the chassis of the electronic pen so as to be exposed in a state depicted in FIG. 8.

Now, in recent years, it has been desired that the electronic pen has a more slender chassis in combination with the progress of the miniaturization and the thinning of the portable terminal utilizing the electronic pen.

In the case where the USB connector 100 is disposed on one opening side of the hollow portion of the chassis of the electronic pen, the length in the alignment direction of a plurality of contact conductors 105 of the contact portion 102 of the USB connector 100, and the length (width) in the same direction of the circuit board 110 become a problem. In the case where the hollow portion of the cylindrical chassis of the electronic pen has a columnar shape, both of these lengths must be each smaller than an inner diameter of the hollow portion.

However, in case of the existing USB connector 100 having the construction described above, protrusion portions 104b, 104c, 104d, and 104e of the shell 104 are formed in both end portions in the alignment direction of a plurality of contact conductors 105 of the contact portion 102, and are, respectively, fitted to the fitting holes 110b, 110c, 110d, and 110e provided in a ground conductor (not depicted) of the circuit board 110 and are then soldered. As a result, the connector 110 is mounted to the circuit board 110. For this reason, a width of the circuit board 110, that is, a length of the circuit board 110 in the alignment direction of a plurality of contact conductors 105 of the contact portion 102 of the USB connector 100 becomes larger than the length L in the alignment direction of the shell 104.

Therefore, with the construction of the existing USB connector 100, even if the length L in the alignment direction of a plurality of contact conductors 105 of the contact portion 102 of the shell 104 of the USB connector 100 is made smaller than a diameter of the cylindrical hollow portion of the chassis of the objective electronic pen, the length in the alignment direction of the circuit board 110 to which the USB connector 100 is to be mounted is long. Therefore, there is a problem that the diameter of the cylindrical hollow portion of the chassis of the electronic pen must be made larger, which becomes an obstacle of the slimming down of the chassis of the electronic pen.

BRIEF SUMMARY

In the light of the foregoing, it is therefore an object of the present disclosure to provide an electronic pen which enables one or more of the problems described above to be solved.

In order to solve one or more of the problems described above, the present disclosure teaches an electronic pen having a cylindrical chassis, a circuit board disposed within a pillar-shaped hollow portion of the chassis, the circuit board having a planar surface that extends in an axial direction of the hollow portion of the chassis, and a connector disposed in the pillar-shaped hollow portion of the cylindrical chassis, the connector being exposable from an opening in an axial direction of the chassis to outside of the chassis and adapted to be coupled to a mating connector inserted from a direction along the axial direction of the chassis. The connector includes a housing having a contact portion and a base portion coupled to each other in the axial direction of the chassis, and a shell covering at least the base portion of the housing. The contact portion the connector has a planar surface that extends in a direction along the axial direction of the chassis, and a plurality of contact conductors configured to be electrically connected to the mating connector is formed on the planar surface. The shell has a first size in a direction parallel to the planar surface of the contact portion and orthogonal to the axial direction of the chassis that is smaller than a diameter of the hollow portion of the chassis. The shell is coupled to the circuit board in a state in which the direction of the first size of the shell is parallel to the planar surface of the circuit board, and in a state in which a width of the circuit board in a direction orthogonal to the axial direction of the circuit board is less than the first size of the shell.

According to the electronic pen having the construction described above, the first size of the shell in the direction parallel to the planar surface of the contact portion, and orthogonal to the axial direction of the chassis of the electronic pen is larger than a second size of the shell in the direction orthogonal to the planar surface of the contact portion. In addition, the width of the circuit board in the direction orthogonal to the axial direction of the chassis is smaller than the first size of the shell.

Then, the shell is coupled to the circuit board in a state in which a surface of the shell and the planar surface of the circuit board face each other, in a state in which the direction of the first size of the shell is parallel to the planar surface of the circuit board, and in a state in which the width of the circuit board in the direction orthogonal to the axial direction of the circuit board is less than the first size of the shell. Therefore, the maximum size becoming a problem during the accommodation in the hollow portion of the chassis is not the width in the direction orthogonal to the axial direction of the circuit board, but is the first size of the shell.

Therefore, the first size of the shell of the connector is made smaller than the diameter of the hollow portion of the chassis of the electronic pen, thereby enabling the connector to be accommodated within the hollow portion of the chassis without taking the width of the circuit board into consideration. Accordingly, the connector can be accommodated within an electronic pen having a slim type of chassis.

BRIEF DESCRIPTION OF THE DRAWINGS

FIG. 1A, FIG. 1B, and FIG. 1C are views for explaining an electronic pen according to an embodiment of the present disclosure;

FIG. 2A, FIG. 2B, and FIG. 2C are views for explaining an example of a construction of a connector used in an electronic pen according to an embodiment of the present disclosure;

DETAILED DESCRIPTION OF THE PREFERRED EMBODIMENTS

Figure 3:
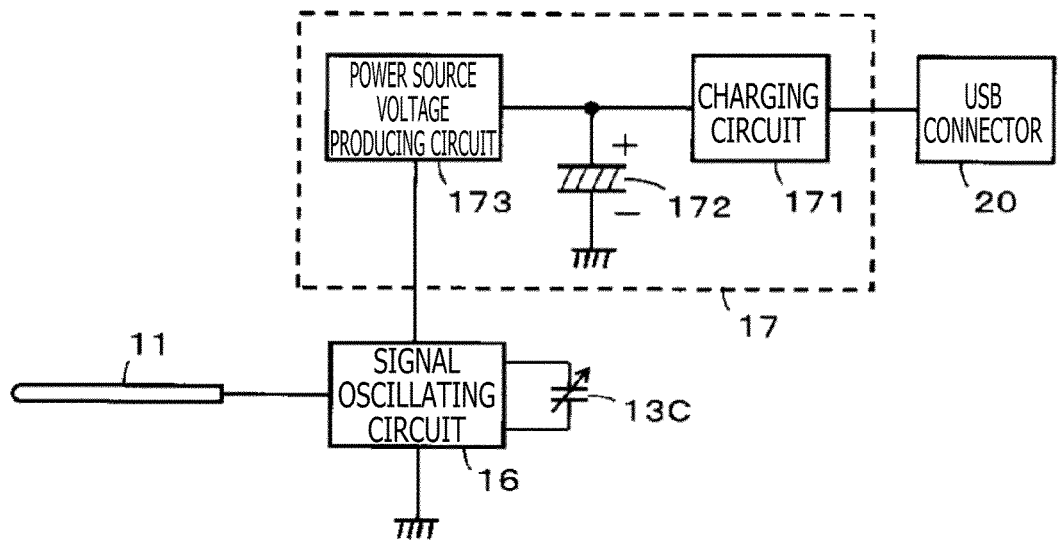
FIG. 3 is a circuit diagram depicting a circuit example of an electronic circuit of an electronic pen according to an embodiment of the present disclosure.

Hereinafter, embodiments of an electronic pen according to the present disclosure will be described by giving, an example, an active capacitance electronic pen with reference to the accompanying drawings.

FIG. 1A, FIG. 1B, and FIG. 1C are views for explaining an example of an electronic pen 1 according to an embodiment of the present disclosure. The electronic pen 1 of the embodiment has a construction in which a component group composing the electronic pen 1 is accommodated in a pillar-shaped hollow portion 2a of a chassis 2 having a cylinder-shaped exterior appearance.

FIG. 1A is a view depicting a state in which the chassis 2 is broken along an axial direction of the pillar-shaped hollow portion 2*a* for the purpose of explaining the component group composing the electronic pen 1 in the inside of the pillar-shaped hollow portion 2*a* of the chassis 2 of the electronic pen 1 of the embodiment. In addition, FIG. 1B is a view when viewing the electronic pen 1 from an opening 2*b* on a side opposite to a pen tip side of the chassis 2 (hereinafter referred to as a rear end side) in the axial direction with a cap 3 which will be described later being removed away. Moreover, FIG. 1C is an enlarged view of the rear end side of the chassis 2 of FIG. 1A.

As depicted in FIG. 1A, the chassis 2 is formed in such a way that a pen head side tapers, and an opening 2*c* which is constructed in such a way that a core body 11 can be inserted thereinto is formed in a head portion of the chassis 2. In addition, an opening 2*b* having the same diameter as that of the hollow portion 2*a* is provided in a side opposite to the pen tip side of the chassis 2, and the cap 3 is adapted to be fitted to the chassis 2 so as to close the opening 2*b*. In this case, the cap 3 is detachable.

The core body 11 is made of a conductive metal or a resin mixed with a conductive material in the electronic pen 1 of the embodiment. An end portion on a side opposite to the tip portion of the core body 11, as depicted in FIG. 1A, is fitted to a pressure transmitting member 12. The pressure transmitting member 12 is constructed in such a way that a side opposite to a side on which the core body 11 is fitted to the pressure transmitting member 12 is fitted to a pen pressure detecting member 13 to transmit a pressure (pen pressure) applied to the core body 11 to the pen pressure detecting member 13.

The pressure transmitting member 12, in this example, is made of a conductive elastic body, for example, a conductive rubber or the like, and a signal from a signal oscillating circuit 16 which will be described later is supplied to the core body 11 through the pressure transmitting member 12.

The pen pressure detecting member 13, for example, is constructed by a member using a mechanism for changing a capacitance of a capacitance variable capacitor in response to an applied pressure (pen pressure). For example, Japanese Patent Lain-Open No. 2011-186803 discloses this member. It should be noted that the pen pressure detecting member may use a member in which the capacitance variable capacitor includes a semiconductor chip having a micro electro mechanical systems (MEMS) element. For example, Japanese Patent Lain-Open No. 2013-161307 discloses this member. It should be noted that the construction of the pen pressure detecting member 13 is by no means limited to these examples.

The pen pressure detecting member 13 is held by a pen pressure detecting member holder portion 14*a* of a holder 14. The holder 14 is provided with a circuit board placement holder portion 14*b* as well. Then, a circuit board 15 is placed on and held by the circuit board placement holder portion 14*b* of the holder 14. As depicted in FIG. 1A, the circuit board 15 is a plate-shaped body of a flat plate and in this example, has a rectangular shape which is slender in an axial direction of a hollow portion 2*a* of the chassis 2.

On a flat plate surface 15*a* of the circuit board 15 as the plate-shaped body of the flat plate (hereinafter referred to as a board surface) 15*a*, in this example, a signal oscillating circuit 16 for generating a signal which is to be sent to a position detecting device through the core body 11 is provided, and a power source circuit 17 is also provided. Then, in this example, a USB connector 20 is mounted to an end portion on an opening 2*b* side of the chassis 2 of the board surface 15*a* of the circuit board 15. As will be described later, the power source circuit 17 is provided with a chargeable power storage element 172 and a charging circuit 171 (refer to FIG. 3).

As depicted in FIG. 1A, FIG. 1B, and FIG. 1C, the USB connector 20 is provided with a housing 23 having a contact portion 21 and a base portion 22, and in this case, a shell 24 for covering the base portion 22 of the housing 23. FIG. 2A, FIG. 2B, and FIG. 2C are views for explaining an example of the USB connector 20. FIG. 2A depicts the housing 23, and FIG. 2B depicts the shell 24. The housing 23 depicted in FIG. 2A, and the shell 24 depicted in FIG. 2B are coupled to each other, thereby forming the USB connector 20 as depicted in FIG. 2C.

The housing 23, for example, is made of a resin, and has the construction similar to that of the housing 103 of the existing USB connector 100 described above. That is to say, as depicted in FIG. 2A, when the USB connector 20 is accommodated in the hollow portion 2*a* of the chassis 2 of the electronic pen 1, the contact portion 21 and the base portion 22 of the housing 23 are linked to each other in a direction becoming the axial direction of the hollow portion 2*a*.

The contact portion 21 is constructed by the plate-shaped body of the flat plate. On the front surface (plane surface) 21*a* and the back surface (plane surface) 21*b* of the plate-shaped body, as depicted in FIG. 2A, a plurality of line-shaped contact conductors 25 is arranged extending in the axial direction of the hollow portion 2*a*, and with being aligned so as to be arranged side by side in parallel to one another. An alignment direction of the contact conductors 25 of the contact portion 21 is a direction orthogonal to the axial direction of the hollow portion 2*a* of the chassis 2.

The base portion 22 has a flat shape having a thickness which is slightly larger than a plate thickness of the contact portion 21, and a length which is slightly longer than a length in the alignment direction of a plurality of contact conductors 105 of the contact portion 102. The housing 23 has a shape such that the contact portion 21 is set upright in a direction in which the contact portion 21 is orthogonal to the end surface 22*a* from a central portion of the end surface 22*a*, of the coupling portion to the contact portion 21, of the base portion 22.

As depicted in FIG. 2A and FIG. 2B, the base portion 22 is provided with a terminal portion 22*b* in which a plurality of terminal conductors 26 individually electrically connected to a plurality of contact conductors 25 of the contact portion 21 is formed on a side opposite to the side of the coupling to the contact portion 21. A plurality of contact conductors 25 and a plurality of terminal conductors 26 are electrically connected to each other in the base portion 22.

As depicted in FIG. 2B, the shell 24 has a cylindrical shape having a hollow portion 24*a* which is slightly larger than the flat-shaped base portion 22. A length L1 (refer to FIG. 1B, and FIG. 2B and FIG. 2C) in the alignment direction of a plurality of contact conductors 25 of the contact portion 21 is a length obtained by adding the thickness of the shell 24 to the length in the alignment direction of a plurality of contact conductors 25 of the contact portion 21 of the base portion 22. In addition, a length L2 (refer to FIG. 1B and FIG. 2B) in a thickness direction of the contact portion 21 of the shell 24 is a length obtained by adding a thickness of the shell 24 to a length in a thickness direction of the contact portion 21 of the base portion 22, and is shorter than the length L1 described above (L1>L2). In this case, the length L1 of the shell 24, in this example, as depicted in FIG. 1B, is selected smaller than the diameter of the hollow portion 2*a* of the chassis 2.

In addition, in case of this example, the length in the axial direction of the cylinder-shaped shell 24 is selected approximately equal to a length in the direction of the linking between the base portion 22 and the contact portion 21 of the housing 23. That is to say, in this example, the shell 24 has such a size as to cover only the portion of the base portion 22 of the housing 23.

As depicted in FIG. 2C, the shell 24 surrounds the base portion 22 in a state in which the end surface 22a side of the base portion 22 is exposed, thereby forming the housing 23 to the inside of the shell 24. Therefore, the USB connector 20 protrudes from the end surface 22a of the base portion 22 to be exposed in a state in which the contact portion 21 of the housing 23, as depicted in FIG. 2C, is not covered with the shell 24.

In case of this example, a cut-out portion 24e, as depicted in FIG. 2B, is provided in a position corresponding to the terminal portion 22b of the base portion 22 of the housing 23. As a result, in the USB connector 20, the terminal portion 22b of the base portion 22 is constructed so as to be exposed from the plane surface portion 24d corresponding to the board surface 15a of the circuit board 15 of the shell 24.

Then, in case of this example, the shell 24 is made of a conductive metal, and is electrically connected to a ground conductor (not depicted) as a reference electric potential conductor provided in the base portion 22 of the housing 23.

Then, as depicted in FIG. 2B and FIG. 2C, the shell 24 is provided with a plurality of protrusion portions for connection to the circuit board 15, in this example, two protrusion portions 24b and 24c. In this case, the two protrusion portions 24b and 24c are provided so as to leave a predetermined interval in a direction of the length L1 of the shell 24. In this example, as depicted in FIG. 2B and FIG. 2C, when the USB connector 20 is mounted to the circuit board 15, these protrusion portions 24b and 24c are formed so as to protrude from a plane surface portion 24d facing the upper surface of the circuit board 15 to the circuit board 15 side. In case of this example, a cutout having a U letter shape is made in a corresponding portion of the plane surface portion 24d, and a portion having a U letter shape produced by making therein the cutout is folded so as to protrude from the plane surface portion 24d, thereby forming the protrusion portions 24b and 24c.

In this case, the two protrusion portions 24b and 24c, as depicted in FIG. 1B, and FIG. 2B and FIG. 2C, are formed in positions within a range of the length L1 in the alignment direction of a plurality of contact conductors 25 of the contact portion 21 in the plane surface portion 24d of the shell 24. Therefore, the interval between the two protrusion portions 24b and 24c becomes smaller than the length L1 of the shell 24.

It is only necessary that a length L3 of the width direction (the direction orthogonal to the axial direction of the chassis 2) of the circuit board 15 (hereinafter referred to as a width of the circuit board 15), as depicted in FIG. 1B, is larger than the interval between the two protrusions 24b and 24c, and can be made smaller than the length L1 of the shell 24.

Then, in a state in which the direction of the length L1 of the shell 24 is parallel to the board surface 15a of the circuit board 15, and in a state in which the plane surface portion 24d of the shell 24 is made to face the board surface 15a of the circuit board 15, and as depicted in FIG. 1B, the width L3 of the board surface 15a of the circuit board 15 falls within the length L1 of the shell 24, the shell 24 is placed on the board surface 15a of the circuit board 15 to be coupled thereto. In the circuit board 15, fitting holes 15b and 15c are formed in positions where the protrusion portions 24b and 24c of the shell 24 are to be fitted to the fitting holes 15b and 15c, respectively. In this example, the fitting holes 15b and 15c are provided within an area in which the ground conductor is formed in the circuit board 15.

Then, as depicted in FIG. 1A, FIG. 1B, and FIG. 1C, the protrusion portions 24b and 24c of the shell 24 are fitted to the fitting holes 15b and 15c of the circuit board 15, respectively, and are then soldered to connect the USB connector 20 to the ground conductor, thereby mounting the USB connector 20 to the circuit board 15.

As has been described so far, in the case where the USB connector 20 of the embodiment described above is used, the width L3 of the circuit board 15 can be made smaller than the length L1 in the alignment direction of a plurality of contact conductors 25 of the contact portion 21 of the USB connector 20 concerned. For this reason, according to the electronic pen 1 of the embodiment, as depicted in FIG. 1B, the diameter of the pillar-shaped hollow portion 2a of the chassis 2 is only made larger than the length L1 in the alignment direction of a plurality of contact conductors 25 of the contact portion 21 of the shell 24 of the USB connector 20, thereby enabling the USB connector 20 mounted to the circuit board 15 to be accommodated in the hollow portion 2a of the chassis 2.

In this case, as depicted in FIG. 1B, in the case where the longest portion in the direction of the length L1 of the USB connector 20 is made equal to the diameter position of the pillar-shaped hollow portion 2a of the chassis 2 of the electronic pen 1, the diameter of the pillar-shaped hollow portion 2a of the chassis 2 of the electronic pen 1 can be made smallest, and the electronic pen 1 can be made most slender.

FIG. 3 depicts an example of a configuration of an electronic circuit including a signal oscillating circuit 16, a power source circuit 17, and the like which are disposed on the circuit board 15 in the electronic pen 1 of the embodiment.

As depicted in FIG. 3, the power source circuit 17 of the electronic pen 1 of the embodiment is provided with a charging circuit 171, a power storage element 172, and a power source voltage producing circuit 173. The power storage element 172, for example, is composed of a lithium-ion battery. The power storage element 172 may not be composed of a second battery, but, for example, be composed of an electric double layer capacitor or the like.

A part of the terminal conductor 26 of the terminal portion 22b provided on the base portion 22 of the housing 23 of the USB connector 20 is connected to the charging circuit 171 of the power source circuit 17.

In the case where the charging is carried out for the electronic pen 1 of the embodiment, the cap 3 is removed from the chassis 2, and as depicted in FIG. 1B, the contact portion 21 of the USB connector 20 is exposed from the opening 2b side of the chassis 2. Then, in this state, the mating connector is inserted along the formation direction of the line-shaped contact conductors 25 of the contact portion 21, that is, in the axial direction of the chassis 2 so as to be coupled to the contact portion 21 of the USB connector 20. Then, a charging current which is sent through the mating connector is supplied to the charging circuit 171 of the power source circuit 17 through the USB connector 20.

With the charging circuit 171, the power storage element 172 is charged with the charging current sent thereto through the USB connector 20 to store therein the power. Then, when the storage voltage of the power storage element 172 becomes equal to or larger than a predetermined value, the power source voltage producing circuit 173 produces a power source voltage, and supplies the power source voltage thus produced as an operation voltage to the signal oscillating circuit 16.

The signal oscillating circuit 16, in this example, is provided with an oscillation circuit, and sends an oscillation signal to a position detecting device through the core body 11. Then, in this example, a capacitance variable capacitor 13C including the pen pressure detecting member 13 is connected to the oscillation circuit of the signal oscillating circuit 16, and an oscillation frequency of the oscillation circuit is changed in response to a capacitance which is made variable in response to the pen pressure for the capacitance variable capacitor 13C. Therefore, in the position detecting device is configured in such a way that by detecting a frequency of a signal from the electronic pen 1, the pen pressure applied to the core body 11 can be detected.

Modified Changes of Embodiment

Figure 4A:
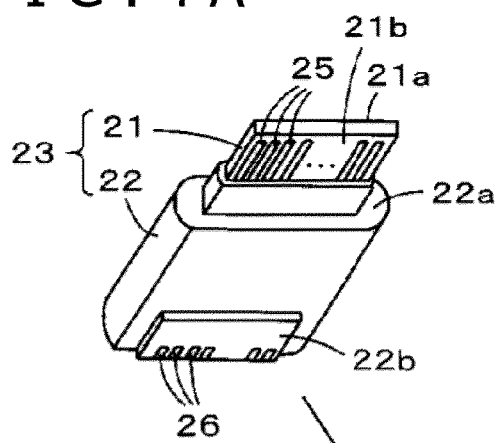
FIG. 4A, FIG. 4B, and FIG. 4C are views for explaining another example of a construction of a connector used in an electronic pen according to an embodiment of the present disclosure.
Figure 4B:
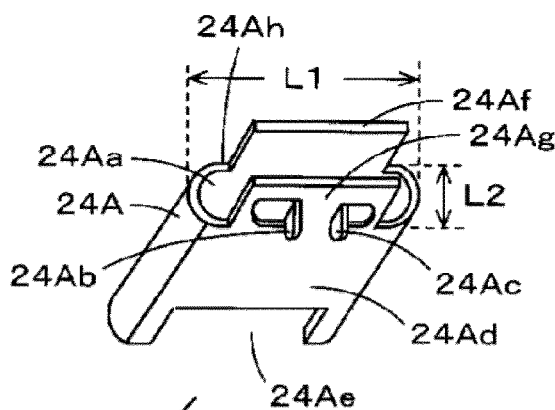
Figure 4C:
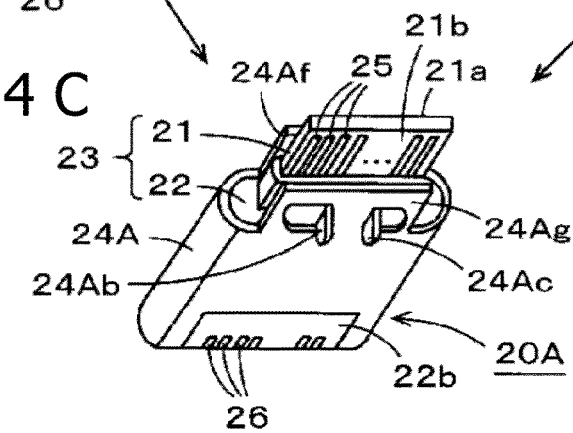

FIG. 4A, FIG. 4B, and FIG. 4C depict another example of the USB connector used in the electronic pen of the embodiment of the present disclosure. A USB connector 20A of another example of FIG. 4A, FIG. 4B, and FIG. 4C is different in construction of a shell 24B from the USB connector 20 used in the electronic pen 1 of the embodiment described above. In the USB connector 20A of this example which will be described below, the same portions as those of the USB connector 20 used in the electronic pen 1 of the embodiment described above are assigned the same reference symbols, and a description thereof is omitted here for the sake of simplicity.

The housing 23 of the USB connector 20A used in an electronic pen 1A of this example, as depicted in FIG. 4A, is constructed exactly similarly to the housing 23 of the USB connector 20 described above.

Then, a shell 24A of the USB connector 20A of this example, as depicted in FIG. 4B and FIG. 4C, not only covers the base portion 22 of the housing 23, but also is constructed to be provided with protruding wall portions 24Af and 24Ag which are parallel to plane surfaces 21a and 21b having the contact conductor 25 of the contact portion 21 formed thereon, and leaves at a predetermined interval.

That is to say, in this example, the protruding wall portion 24Ag, as depicted in FIG. 4B and FIG. 4C, is formed so as to protrude from a plane surface portion 24Ad, facing the board surface 15a of the circuit board 15, of the shell 24A in a state in which the protruding wall portion 24Ag leaves at a predetermined interval from the plane surface 21a having the contact conductor 25 of the contact portion 21 formed thereon. In addition, the protruding wall portion 24Af, as depicted in FIG. 4B and FIG. 4C, is formed so as to protrude from a plane surface portion 24Ah facing a plane surface portion 24Ad of the shell 24A through the hollow portion 24Aa in a state in which the protruding wall portion 24Af leaves at a predetermined interval from a plane surface 21b on a side opposite to the plane surface 21a of the contact portion 21.

In this case, a length in the alignment direction of a plurality of contact conductors 25 of the contact portion 21 in the protruding wall portions 24Af and 24Ag is shorter than the length L1 in the same direction as the alignment direction of the shell 24A (refer to FIG. 4B). In addition, a height in the protrusion direction of the protruding wall portions 24Af and 24Ag is made lower than a height from the base portion 22 of the contact portion 21.

Then, in this example, as depicted in FIG. 4B and FIG. 4C, the protruding wall portion 24Ag protruding from the plane surface portion 24Ad of the shell 24A is provided with two protrusion portions 24Ab and 24Ac. In this case, the two protrusion portions 24Ab and 24Ac project from the shell 24A to the circuit board 15 side so as to leave a predetermined interval in the alignment direction of a plurality of contact conductors 25 of the contact portion 21. A method of forming the protrusion portions 24Ab and 24Ac is similar to that described above.

It goes without saying that since the length in the alignment direction of a plurality of contact conductors 25 of the contact portion 21 of the protruding wall portions 24Af and 24Ag is shorter than the length L1 in the same direction as the alignment direction in the shell 24A, the interval between the two protrusion portions 24Ab and 24Ac is shorter than the length L1.

Therefore, in this example as well, a width L3A (refer to FIG. 5D which will be described later) of the circuit board 15 to which the USB connector 20A is mounted so as to face the plane surface portion 24Ad of the shell 24A can be made smaller than the length L1 in the alignment direction of a plurality of contact conductor 25 of the contact portion 21 of the shell 24 similarly to the case of the embodiment described above. For this reason, even in the case where the USB connector 20A in this example is used, the operation and effect similar to those of the embodiment described above can be obtained.

FIG. 5A, FIG. 5B, FIG. 5C, and FIG. 5D depict views of constructions on a rear end side of the electronic pen 1A when the USB connector 20A of this example is mounted to the circuit board 15. It should be noted that FIG. 5A, FIG. 5B, FIG. 5C, and FIG. 5D are the views corresponding to the enlarged views of the rear end side of the electronic pen 1 of FIG. 1C.

Figure 5A:
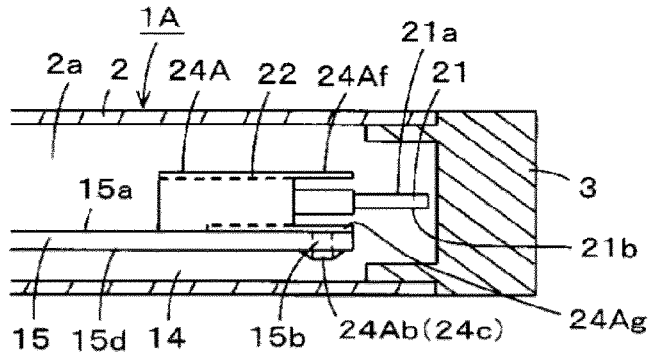
FIG. 5A, FIG. 5B, FIG. 5C, and FIG. 5D are views for explaining an example of a construction of a portion of an electronic pen using the connector of the example of FIG. 4A, FIG. 4B, and FIG. 4C according to an embodiment of the present disclosure.
Figure 5B:
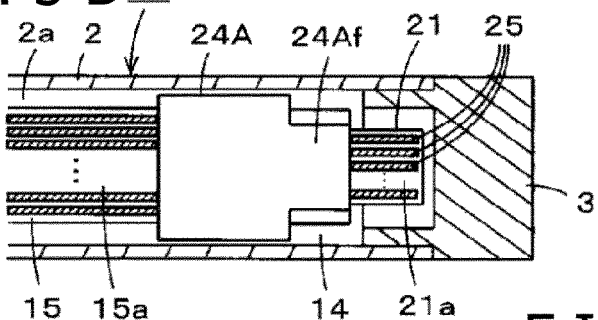
Figure 5C:
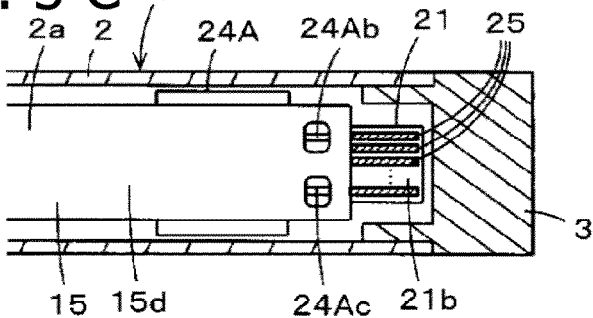
Figure 5D:
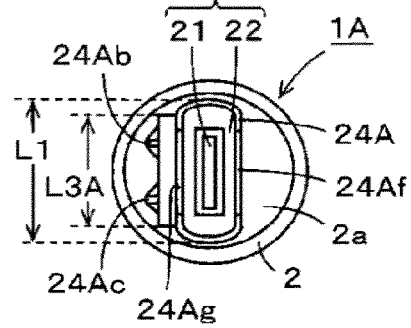

FIG. 5A is a view when viewing the electronic pen 1A from a direction parallel to the board surface 15a of the circuit board 15. In addition, FIG. 5B is a view when viewing the electronic pen 1A from a direction orthogonal to the board surface 15a of the circuit board 15, and from an upper side of the board surface 15a of the circuit board 15. In addition, FIG. 5C is a view when viewed from a side opposite to the board surface 15a of the circuit board 15. Moreover, FIG. 5D is a view when viewed in the axial direction in a state in which the cap 3 is removed away from a rear end of the chassis 2 of the electronic pen 1A.

As depicted in FIG. 5A and FIG. 5C, the protrusion portions 24Ab and 24Ac formed in the protruding wall portion 24Ag of the shell 24A of the USB connector 20A are respectively fitted to the fitting holes 15b and 15c formed in the circuit board 15, and in a surface 15d in a state opposite to the board surface 15a of the circuit board 15 are then soldered to the ground conductor formed in the surface 15d to be electrically connected thereto. As a result, the USB connector 20A is fixed to the circuit board 15.

According to this example, when the mating connector is inserted into the USB connector 20A so as to be connected to a plurality of contact conductors 25 of the contact portions 21 of the USB connector 20A, the tip portion of that mating connector is held between the plane surface 21a and the back-side plane surface 21b of the contact portion 21, and the protruding wall portions 24Af and 24Ag of the shell 24A. Therefore, a movement, in the direction orthogonal to the plane surfaces 21a and 21b of the contact portion 21, of the mating connector inserted into and coupled to the USB connector 20A is regulated to prevent from wobbling. As a result, the electrical connection between both of them is satisfactorily carried out.

Incidentally, the protrusion portions 24Ab and 24Ac provided in the protruding wall portion 24Ag of the USB connector 20A, similarly to the case of the protrusion portions 24b and 24c of the USB connector 20 of the embodiment described above, are formed by folding the U letter-shaped portion produced by making the U letter-shaped cutout in the corresponding portion of the protruding wall portion 24Ag of the shell 24A. However, a method of forming the protrusion portions 24Ab and 24Ac is by no means limited thereto.

Figure 6:
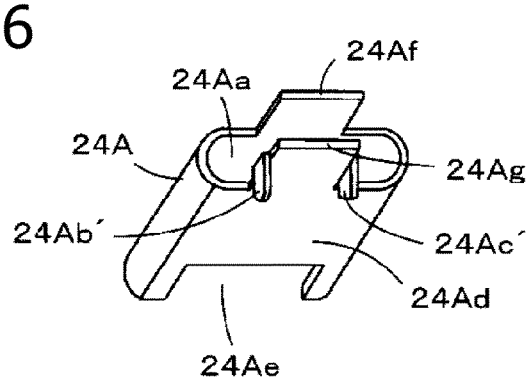
FIG. 6 is a view for explaining still another example of the construction of a connector used in an electronic pen according to an embodiment of the present disclosure.
Figure 7:
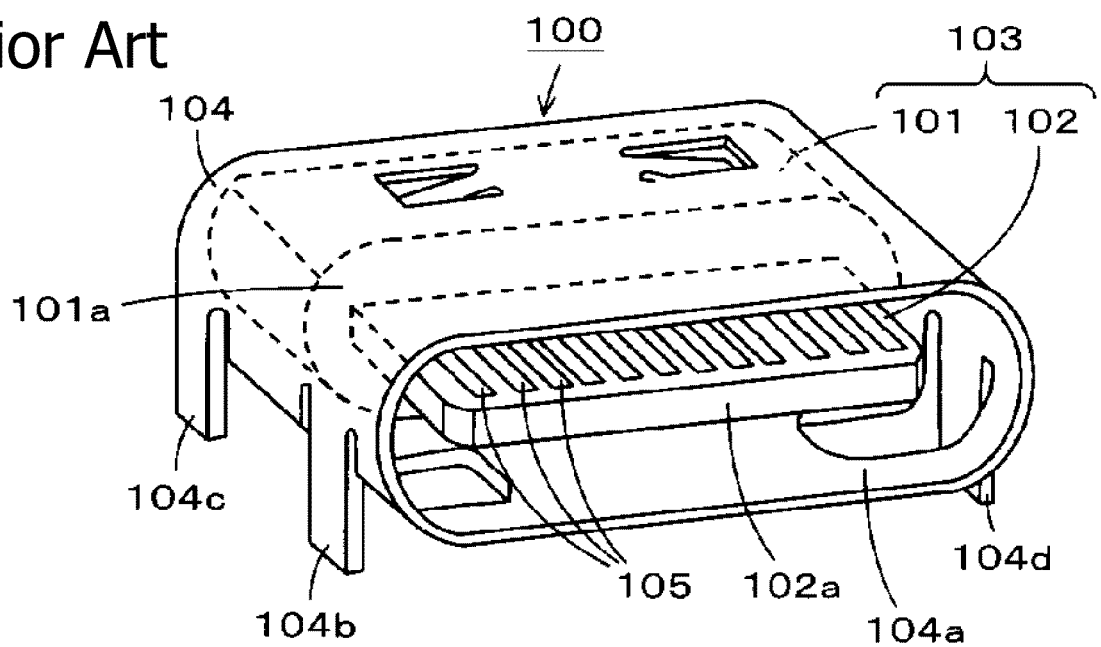
FIG. 7 is a view for explaining an example of an existing connector.
Figure 8:
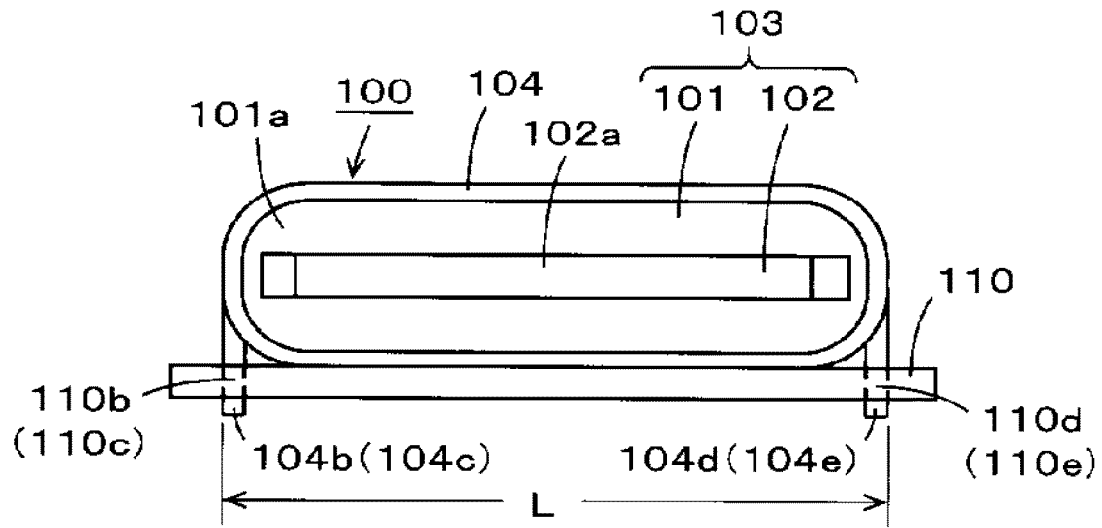
FIG. 8 is a view depicting a state in which the existing connector is mounted to a circuit board.

For example, as depicted in FIG. 6, protrusion portions may be individually formed in both the end portions in the direction of the length L1 of the shell 24A of the protruding wall portion 24Ag, and may be then folded, thereby structuring protrusion portions 24Ab' and 24Ac'.

In addition, in the USB connector 20A of the example of FIG. 4 and FIG. 6, the protrusion portions 24Ab and 24Ac and the protrusion portions 24Ab' and 24Ac' are provided only in the protruding portion 24Ag. However, two protrusion portions, as depicted in FIG. 2B, may be provided in the plane surface portion 24Ad as well in addition to the protrusion portions 24Ab and 24Ac and the protrusion portions 24Ab' and 24Ac'. In such a case, since the USB connector 20A is coupled to the circuit board 15 by the four protrusion portions, the USB connector 20A is more firmly coupled to the circuit board 15.

Other Embodiments or Modified Changes

In the embodiment described above, the present disclosure is applied to the active capacitance type electronic pen. However, the present disclosure can also be applied to an electromagnetic induction type electronic pen or other type electronic pens as long as the electronic pen is provided with a circuit element requiring a drive voltage.

It should be noted that the chassis of the electronic pen of the embodiment described above has the cylindrical shape having the pillar-shaped hollow portion. However, the exterior appearance of the chassis of the electronic pen does not need to have the cylindrical shape as long as the exterior appearance of the chassis of the electronic pen has a pillar-shaped hollow portion, and thus may also have a polygonal cylindrical shape such as a square cylindrical shape or a hexagonal shape.

In addition, the cross section of the pillar-shaped hollow portion of the chassis may not be a true circle, but may be an ellipse. In this case, the USB connector is disposed in such a way that the length L1 of the alignment direction of the contact conductor of the shell corresponds to the direction of the major axis of the ellipse.

It is to be noted that the embodiment of the present disclosure is not limited to the foregoing embodiments, and that various changes can be made without departing from the spirit of the present disclosure.

What is claimed is:

1. An electronic pen comprising:
   a cylindrical chassis;
   a circuit board disposed within a pillar-shaped hollow portion of the chassis, the circuit board having a planar surface that extends in an axial direction of the hollow portion of the chassis; and
   a connector disposed within the pillar-shaped hollow portion of the cylindrical chassis, the connector being exposable from a first opening in an axial direction of the chassis to outside of the chassis and adapted to be coupled to a mating connector inserted from a direction along the axial direction of the chassis,
   wherein the connector includes a housing having a contact portion and a base portion coupled to each other in the axial direction of the chassis, and a shell covering at least the base portion of the housing,
   wherein the contact portion of the connector has a planar surface that extends in the axial direction of the chassis, and a plurality of contact conductors configured to be electrically connected to the mating connector is formed on the planar surface,
   wherein the shell has a first size in a direction parallel to the planar surface of the contact portion and orthogonal to the axial direction of the chassis that is smaller than a diameter of the hollow portion of the chassis,
   wherein the shell of the connector is coupled to the circuit board in a state in which the direction of the first size of the shell is parallel to the planar surface of the circuit board, and in a state in which a width of the circuit board in a direction orthogonal to an axial direction of the circuit board is less than the first size of the shell, and
   wherein the shell includes a conductor that is coupled to the circuit board and electrically connects the shell to a reference electric potential of the circuit board.

2. The electronic pen according to claim 1, wherein a plurality of terminals electrically connected to respective ones of the plurality of contact conductors of the contact portion is provided on a side of the base portion opposite to a side of the base portion that is coupled to the contact portion of the base portion, and the plurality of terminals is electrically connected to the circuit board.

3. The electronic pen according to claim 1, further comprising:
   a power storage element disposed within the hollow portion of the chassis; and
   a charging circuit disposed on the circuit board,
   wherein the connector is connected to the charging circuit, and the power storage element, in operation, is charged through the mating connector by the charging circuit.

4. The electronic pen according to claim 3, further comprising:
   a signal oscillating circuit disposed on the circuit board, wherein the signal oscillating circuit, in operation, oscillates a signal that interacts with a position detecting device,
   wherein a power source voltage based on a power storage voltage of the power storage element is supplied to the signal oscillating circuit.

5. The electronic pen according to claim 1,
   wherein the shell has a projection which projects from a surface facing the circuit board to a side of the circuit board, and
   the projection is disposed in a fitting hole provided in the circuit board and couples the connector to the circuit board.

6. The electronic pen according to claim 1, wherein the shell includes a protruding wall portion which protrudes from the base portion to a side of the contact portion in a state in which the shell is separated from the planar surface of the contact portion by a predetermined distance.

7. The electronic pen according to claim 6, wherein a projection extends outwardly from the protruding wall portion of the shell.

8. The electronic pen according to claim 1, wherein a side of the first opening in the axial direction of the chassis is opposite to a side of a second opening in the axial direction of the chassis in which a core body is provided.

9. The electronic pen according to claim 1, wherein a side of the first opening of the chassis is covered with a detachable cap.

10. The electronic pen according to claim 1, wherein the connector is disposed in the hollow portion of the chassis in a state in which the direction of the first size of the shell of the connector agrees with a direction of the diameter of the hollow portion of the chassis.

* * * * *